United States Patent [19]

Ohashi et al.

[11] Patent Number: 5,190,813
[45] Date of Patent: Mar. 2, 1993

[54] POROUS FLUORORESIN MATERIAL PLATED WITH A METAL

[75] Inventors: Kazuhiko Ohashi; Hiroshi Kato; Takayuki Wani, all of Okayama, Japan

[73] Assignee: W. L. Gore & Associates, Inc., Newark, Del.

[21] Appl. No.: 916,924

[22] Filed: Jul. 20, 1992

[51] Int. Cl.⁵ .............................................. B32B 3/26
[52] U.S. Cl. ............................. 428/319.3; 428/315.5; 428/315.9; 428/319.7; 428/422; 427/337; 427/372.2; 427/404

[58] Field of Search ............... 428/315.5, 315.9, 319.3, 428/319.7, 422; 427/337, 372.2, 402, 404

[56] References Cited

U.S. PATENT DOCUMENTS 4,557,957 12/1985 Manniso ........................... 428/315.5
4,954,388 6/1988 Mallouk ................................. 55/16

Primary Examiner—William J. Van Balen
Attorney, Agent, or Firm—Gary A. Samuels

[57] ABSTRACT

A platinum or platinum-alloy plated porous fluoropolymer membrane where the plated metal adheres to the membrane through a coating of a cation-exchange material on the membrane.

3 Claims, No Drawings

POROUS FLUORORES IN MATERIAL PLATED WITH A METAL

FIELD OF THE INVENTION

The present invention relates to porous polytetrafluoroethylene material plated with a metal.

BACKGROUND OF THE INVENTION

Porous polytetrafluoroethylene polymer materials that have electrically conductive metals plated on them are well known. (See, for example Manniso U.S. Pat. No. 4,557,957.) They find use in the electrochemical field as electrodes in solid electrolyte, gas diffusion electrodes, etc. In addition, they are useful as electromagnetic shielding and as filters or circuit boards. But since polytetrafluoroethylene is highly water repellent and has extremely strong non-stick characteristics, its metallization is very difficult with common metal plating technologies, and even if this plating can be accomplished, the metal cover film is sometimes inadequate, irregular, and unstable. The metallization of the interior surfaces of a porous structure is particularly difficult, and this is even more pronounced when the size of the openings in the porous structure is less than 10 um.

As a means of solving these problems, the prior art has proposed a procedure in which porous polytetrafluoroethylene is immersed in a water-soluble surfactant solution, then the solution replaced with a metal activator means of liquid-liquid substitution, so that a non-electrolytic plating solution can enter the pores of the porous material, and both the surface of the material and the interior of the porous structure are plated.

Platinum metals and platinum group alloys exhibit favorable characteristics as electrode materials, that are used in the electrochemical industry, and also perform well when used in sensors, electromagnetic shielding materials, catalyst materials, printed substrates, antennas and other transmitter-receiver materials, and the like.

Therefore, although the above-mentioned plating technique is indeed useful, said technique requires that the porous polytetrafluoroethylene material be hydrophilicized with a watersoluble activator, and since this water-soluble activator will elute into an aqueous solution, the material loses much of its hydrophilicity just by being immersed in and then taken out of an aqueous solution. Consequently, the plating must be performed by carrying out a liquid-liquid substitution after the hydrophilization. This requires that the time, degree of immersion, pressure, and other factors be controlled, and since a non-electrolytic plating process generally involves repeated immersions into an aqueous solution, the substitution has to be repeated each time, thus requiring a number of steps. Furthermore, the control of these factors is not an easy task.

Also, to perform the plating, the object to be plated is, for example, immersed in a strongly acidic aqueous solution of tin(II) chloride to cause $Sn^{2+}$ to be adsorbed on the surface, after which the object is rinsed with water and then immersed in a strongly acidic palladium chloride aqueous solution. A small amount of palladium is deposited on the surface of the object, and the object activated. The drawback in this case, however, is that it is difficult to deposit enough palladium to achieve activation with just one immersion, and in actual practice this process has to be repeated. The activation tends to be particularly uneven when activating a film substrate.

Moreover, the only materials that will form a suitable plating on a non-metal with this method are cobalt, copper, and nickel.

Meanwhile, with platinum metals and platinum group alloys, since the reduction of platinum group ions proceeds more rapidly than with other metals, the stability of the plating bath is poor and it is difficult to cause platinum to be selectively deposited on only the object to be plated. For these and other reasons, plating is extremely difficult with platinum metals and platinum group alloys.

Further, plating of the interior surfaces in a porous structure is difficult, and even if such plating can be accomplished, the deposition is sometimes not satisfactory.

SUMMARY OF THE INVENTION

The product of the present invention is a platinum metal or platinum group alloy plated on a porous polytetrafluoroethylene material. The porous material has numerous pores extending through it, and a film of platinum or a platinum complex is formed at least on the inside of the pores of said material using a cation exchange resin as bonding agent.

In the process of the invention, a cation exchange resin layer is formed throughout substantially the entire porous structure. When this substrate is immersed in an aqueous solution, the aqueous solution will be able to percolate adequately into the interior of the porous structure thereof. There is substantially no elution caused by water, and thus no drop in hydrophilicity when the material is repeatedly put into a plating bath and rinsed with water. The cation exchange resin should be a fluororesin that has sulfonic acid groups or carboxylic acid groups, and should preferably be one that will not alter the chemically inertness of the polytetrafluoroethylene material.

The amount in which the above-mentioned cation exchange resin is made to adhere with respect to porous material is generally 0.05 to 100 mg/m$^2$, with 5 to 20 mg/m$^2$ being preferably. By then depositing a platinum metal or a platinum group alloy on and causing it to adhere to this cation exchange resin layer, a nearly uniform, stable plating is formed with excellent strength. Furthermore, despite being a highly water repellent fine porous structure, a uniform and stable layer is formed not only on the surface of the substrate, but also in the interior thereof, i.e., in the thickness direction. The cation exchange resin is deposited on the porous structure simply by immersing the structure in a solution of the resin.

After the cation exchange resin is adhered, hydrophilicization is performed. The product is immersed in methanol or another such organic solvent, then immersed in distilled water to perform a substitution between the organic solvent and the water for at least ten minutes, and preferably one hour or longer, and is then boiled in this state to adapt it to water, thereby making the product hydrophilic. As a result of this hydrophilicization, the cation exchange coating adheres well and when the fine porous structure is immersed in an aqueous solution, the aqueous solution is able to sufficiently penetrate into the interior of the structure, without any elution being caused by the water.

Next, a platinum ammine ion complex is substituted with the exchange groups of the above-mentioned cation exchange resin by means of an ion exchange reaction. The metal ion complex at a suitable concentration is brought into contact with the cation exchange resin, and nearly the entire amount of the complex can be ion exchanged and adsorbed onto the cation exchange resin.

Following that, the porous material is immersed in a sodium borohydride aqueous solution (reducing agent) and a small amount of platinum is deposited to produce plating seeds.

Finally, the "seeded" material is immersed in a plating bath made up of chloroplatinic acid and hydrazine hydrochloride (reducing agent), and platinum is then selectively deposited and grown on the plating seeds.

By this procedure, the following plating can be carried out:

1. Both-side plating in which both sides of the sheet are conductive throughout the entire thickness direction of the sheet.
2. Both-side plating in which only both surfaces of the sheet are conductive.
3. One-side plating in which only one surface of the sheet is conductive.

A fine porous polytetrafluoroethylene material that is in the form of a tube can be plated with any of the following methods.

1. Both-side plating in which the tube is conductive on its surface, its inner wall, and throughout the entire thickness direction of the tube.
2. Both-side plating in which the tube is conductive only on it surface and on its inner wall.
3. One-side plating in which only the surface of the tube is conductive.
4. One-side plating in which only the inner wall of the tube is conductive.

The plating thickness in the pore interior is generally from 10 A to 1 um, with 500 A to 1 um being preferable.

Because a platinum metal or a platinum group alloy is made to adhere to a surface whose primary material is polytetrafluoroethylene, the resulting finished product is ideally suited to electrodes used in electrochemical applications, and since this product is porous, its actual surface area is extremely large, which therefore provides a large reaction surface area. Furthermore, unlike a platinum sheet electrode, for example, the flexibility and toughness of the material allow it to be molded into an electrode of any shape, and the use of this electrode allows the electrolysis tank to be made more compact, among other such benefits. And, as mentioned above, the amount in which a costly platinum metal or platinum group alloy is used is small.

If this product is then laminated with a fine porous polytetrafluoroethylene material, the resulting product will be ideally suited to use a gas diffusion electrode. Specifically, such a gas diffusion electrode is generally a porous electrode, one side of which is in contact with electrolyte, and the other side of which is in contact with a reaction gas, in which a three-phase interface between the electrode, the reaction gas, and the electrolyte must be formed inside the gas diffusion electrode, and which must meet strict conditions, e.g., the electrode must be resistant to chemicals and corrosion, and there must be no leakage of the electrolyte to the reaction gas side, nor any bubbling of the reaction gas to the electrolyte side. The above-mentioned laminate is able to satisfy all of these requirements by positioning the platinum-metal- or platinum-group-alloy-plated fine porous polytetrafluoroethylene material on the electrolyte side and positioning the fine porous polytetrafluoroethylene material on the gas side, thus providing an ideal gas diffusion electrode.

When the present invention is used as a laminate as above, its structure is not limited to that described above. Neither is the present invention limited to a sheet or a tube. The fine porous polytetrafluoroethylene material can also be covered when it is in the form of a rod, a yarn, a sphere, etc., and an electrical wire or cable that is insulated with a fine porous polytetrafluoroethylene material can also be covered with metal. The metal covering can also be made in the form of a layer by performing electroplating or non-electrolytic plating over this material of the present invention.

The porous polytetrafluoroethylene material that is used as the base material is a film or tube that has undergone a stretching treatment by a means such as that discussed in U.S. Pat. No. 3,953,566 or U.S. Pat. No. 4,187,390. The porosity thereof is usually 25 to 98%.

Measurement of the volumetric resistance of the abovementioned finished products produced results of at least $1 \times 10^{-4}$ ohms, and the Gurley number, as measured in ASTM D726-58, was at least 10. The adhesive strength of the platinum metal or platinum group alloy was tested using the test tape discussed in JIS Z 1522, by sticking this tape to the plating surface, pressing it with a finger, then holding the end of the tape and firmly peeling it vertically away from the plating surface, which revealed no adhesion of the plating layer to the sticky surface of the tape.

EXAMPLES

Specific practical examples of the present invention will now be given along with the manufacturing method thereof, but naturally, the present intention is not limited to or by these specific examples.

PRACTICAL EXAMPLE 1

A porous circular expanded polytetrafluoroethylene film with a diameter of 50 mm that had a thickness of 40 um, a porosity of 80%, was subjected to desorption washing by immersion in acetone for five minutes. The film was then immersed in a solution obtained by dissolving a cation exchange resin called "Nafion" (brand name, DuPont Co.), which is a copolymer of tetrafluoroethylene and sulfonyl fluoride vinyl ether, in alcohol and then adjusting the concentration of this solution to 2 wt% with ethanol. This film was then heated and dried for approximately one hour to 100° C. to cause said cation exchange resin to adhere to the porous polytetrafluoroethylene film.

This film was next immersed in a methanol solution and substitution with the methanol solution was performed all the way into the fine porous interior. After this, the film was immersed for approximately one hour in distilled water to adapt said cation exchange resin to water, thereby making the film hydrophilic, but there was no elution of said cation exchange resin in the methanol solution.

During the plating process, the film was kept in a wet state, i.e., it was kept from coming into contact with air for at least 30 minutes continuously, and after hydrophilicization, the substrate was stored in distilled water. The steps comprised by the plating were adsorption, washing with water, reduction, washing with water, growth and washing with water, in that order. The principal steps will now be described:

Adsorption

A film that had undergone the above-mentioned hydrophilicity treatment was immersed for approximately 15 minutes at ambient temperature in a 100 ml aqueous solution of a platinum ammine complex containing 0.08 mg/ml platinum, and the entire amount of platinum ammine complex ions was ion exchanges and adsorbed into the cation exchange resin.

Reduction

The above product was immersed for approximately one hour at ambient temperature in a 0.5% sodium borohydride aqueous solution, and the platinum ammine complex ions that had been ion exchanged and adsorbed into the cation exchange resin were reduced, thereby depositing a small amount of platinum.

Growth

This film was immersed for 120 minutes at 40° C. in a plating solution obtained by adding 0.26 g of chloroplatinic acid hexahydrate to a 100 ml aqueous solution in which 0.9 g of hydrazine hydrochloride had been dissolved, thereby plating the film with platinum. Here, the thickness of the plating that surrounded the nodules and fibers was approximately 2000 angstrom, and the amount of deposited platinum was 2 mg/cm$^2$.

PRACTICAL EXAMPLE 2

Platinum-rhodium alloy plating was performed using a cation exchange resin-adhered fluororesin film produced in the same manner as in Practical Example 1. The plating process was the same as in Practical Example 1, but the adsorption, reduction, and growth steps were as follows:

Adsorption

A 100 ml aqueous solution was produced by adding distilled water to 0.2 g of chloroplatinic acid hexahydrate, 0.1 g of rhodium chloride trihydrate, and 10 ml of ammonia water (28%). The film was immersed in this aqueous solution for one hour at 60° C.

Reduction

The reduction step was carried out in exactly the same manner as in Practical Example 1.

Growth

This film was immersed for 120 minutes at 60° C. in a plating solution obtained by adding 0.1 g of chloroplatinic acid hexahydrate and 0.1 g of rhodium chloride trihydrate to a 100 ml aqueous solution in which 0.9 g of hydrazine hydrochloride had been dissolved, thereby plating the film with an alloy of platinum and rhodium. Here, the thickness of the plating that surrounded the nodules and fibers was approximately 1500 A, and the amount of deposited platinum-rhodium alloy was 3 mg/cm$^2$.

PRACTICAL EXAMPLE 3

The platinum plating results were examined using the amount of ion exchange resin as a parameter. The evaluation was performed as in Practical Example 1 while varying the ion exchange resin concentration and the number of impregnations, the results of which are given in Table 1.

TABLE 1

| Amount of Ion Exchange Resin (mg/m$^2$) | Concentration (wt %) | Number of Impregnations | Volumetric Resistance (ohms m) | Remarks |
| --- | --- | --- | --- | --- |
| 75 | 2 | 6 | $3 \times 10^{-4}$ | |
| 15 | 2 | 1 | $5 \times 10^{-4}$ | Practical Example 1 |
| 8 | 1 | 1 | $1 \times 10^{-3}$ | |
| 0.07 | 0.01 | 1 | infinitely great | Thin plating in some places |
| 0.04 | 0.007 | 1 | infinitely great | Plating not possible |

The amount of the ion-exchange resin was determined by calculation, using the formula $$R = \frac{W - Wo}{A}$$

where W is the weight of the film containing ion-exchange resin, Wo is the weight of the original film and A is the area of the film.

When the ion exchange resin concentration was 2 wt % and the number of impregnations was six, the fine porous interior of the fine porous polytetrafluoroethylene material was nearly filled with the ion exchange resin. Consequently, there was virtually no increase in the amount of ion exchange resin present when impregnation was performed seven times. As a result, impregnation in an amount in excess of 100 mg/m$^2$, which serves as a limiting value, is not possible. Specifically, it was learned that the amount of ion exchange resin is generally 100 to 0.05 mg/m$^2$.

As discussed above, the present invention offers a new product in which a porous polytetrafluoroethylene substrate is uniformly and effectively plated with platinum or a platinum alloy, and also offers a favorable manufacturing method thereof. This product has a large reaction surface area when used as an electrode material, etc., in electrochemical applications, and since this product is flexible and tough, the electrode can be molded into any shape, which allows the electrolysis tank, etc., to be made more compact. This product is also ideal for use in gas diffusion electrodes, wiring substrates, antennas and other transmitter-receiver materials, conductive filtration membranes, sensors, electromagnetic shield materials, catalyst materials, conductive garments, flexible materials, and the like, and provides outstanding performance in these areas.

We claim:
1. A porous polytetrafluoroethylene material comprising:
    a porous polytetrafluoroethylene substrate,
    a cation-exchange resin coated on the inside pore surface of the substrate,
    at least one layer of platinum metal or platinum alloy bonded to the cation-exchange resin.
2. The material of claim 1 wherein the cation-exchange resin is a copolymer of tetrafluoroethylene and sulfonyl fluoride vinyl ether.

3. Process for preparing the material of claim 1 which comprises, in sequence,
   1. washing a porous, expanded polytetrafluoroethylene membrane in acetone,
   2. immersing the membrane in a solution of a cation exchange resin,
   3. drying the membrane,
   4. immersing the membrane in methanol,
   5. immersing the membrane in water,
   6. immersing the membrane in a solution of a platinum amino complex,
   7. immersing the membrane in an alkali metal borohydride solution,
   8. immersing the membrane in a chloroplatinic acid hexahydrate solution containing hydrazine hydrochloride.

* * * * *